United States Patent [19]

Greub et al.

[11] Patent Number: 4,912,399
[45] Date of Patent: Mar. 27, 1990

[54] MULTIPLE LEAD PROBE FOR INTEGRATED CIRCUITS IN WAFER FORM

[75] Inventors: Hans J. Greub, Troy, N.Y.; Valdis E. Garuts, Beaverton, Oreg.

[73] Assignee: Tektronix, Inc., Beaverton, Oreg.

[21] Appl. No.: 59,903

[22] Filed: Jun. 9, 1987

[51] Int. Cl.⁴ .......................... G01R 1/02; G01R 1/04
[52] U.S. Cl. ............................ 324/158 P; 324/158 F; 324/72.5
[58] Field of Search ............ 324/72.5, 73 PC, 158 P, 324/158 F

[56] References Cited

U.S. PATENT DOCUMENTS

| | | | |
|---|---|---|---|
| 3,596,228 | 7/1971 | Reed et al. | 324/158 P |
| 4,567,433 | 1/1986 | Ohkubo et al. | 324/72.5 |
| 4,574,235 | 3/1986 | Kelly et al. | 324/158 F |
| 4,636,722 | 1/1987 | Ardezzone | 324/158 P |
| 4,649,339 | 3/1987 | Grangroth et al. | 324/72.5 |
| 4,733,172 | 3/1988 | Smolley | 324/158 P |

FOREIGN PATENT DOCUMENTS

| | | | |
|---|---|---|---|
| 0180013 | 5/1986 | European Pat. Off. | 324/72.5 |
| 2571861 | 4/1986 | France | 324/158 F |
| 0231336 | 11/1985 | Japan | 324/158 P |

Primary Examiner—Reinhard J. Eisenzopf
Assistant Examiner—W. Burns
Attorney, Agent, or Firm—John D. Winkelman; Daniel J. Bedell

[57] ABSTRACT

A probe assembly for use in conveying signals between cables from test apparatus and contact areas on a contact face of an integrated circuit includes a support member having an aperture therein and a dielectric membrane clamped over the aperture such that conductive bumps mounted on the underside of the periphery of the membrane engage corresponding contact areas on an upper surface of the support member surrounding the aperture. A central area of the membrane extends downward through the aperture such that conductive bumps on the under side of the central area of the membrane engage contact areas on the contact face of an integrated circuit situated below the aperture. A plurality of conductor runs supported by the membrane extend from the conductive bumps in the central area of the membrane to the conductive bumps in the periphery of the membrane. A plurality of second conductor runs supported by the support member extend from the contact areas surrounding the aperture to test apparatus cable connectors adjacent to the periphery of the support member.

11 Claims, 1 Drawing Sheet

MULTIPLE LEAD PROBE FOR INTEGRATED CIRCUITS IN WAFER FORM

This invention relates to a multiple lead probe for integrated circuits in wafer form.

BACKGROUND OF THE INVENTION

An important aspect of the manufacture of integrated circuits is the testing of an integrated circuit in order to verify that it operates according to specifications. Although the circuit could be tested after the integrated circuit has been packaged, the expense involved in dicing the wafer and packaging the individual integrated circuits makes it advantageous to test the integrated circuit as early as possible in the fabrication process so that unnecessary efforts will not be expended on faulty devices. It is therefore desirable that these circuits be tested either immediately after wafer fabrication is completed, and before separation into dice, or after dicing but before packaging. In either case, it is necessary to make electrical connection to all the circuit's external connections (usually bonding pads) in a nondestructive way, so as not to interfere with subsequent packaging and connection operations.

It is preferable that an integrated circuit be tested under its design operating conditions and to the extremes of its design performance range. In particular, typical high speed circuits are designed to operate with input and output signal bandwidths exceeding 1 GHz, and operation of such circuits should be evaluated at these high frequencies.

It has previously been proposed that an integrated circuit be tested using a probe comprising a body of elastomer having conductor runs of metals deposited on one face thereof. This probe is subject to a number of disadvantages. For example, the probe is not capable of supporting signals at frequencies above a few hundred megahertz without serious signal degradation, and it has poor mechanical stability owing to the large difference in elasticity of the elastomer body and the metallic conductor runs.

U.S. patent application Ser. No. 812,145 filed Dec. 23, 1985, the disclosure of which is hereby incorporated by reference herein, discloses a probe assembly for use in testing an integrated circuit. The probe assembly comprises a stiff support member formed with an aperture, and an elastically-deformable membrane. Both the support member and the membrane comprise dielectric material and portions of conductive material supported by the dielectric material in electrically-insulated relationship. The portions of conductive material of the membrane constitute inner contact elements distributed over a first main face of the membrane in a first pattern that corresponds to the pattern of contact areas on the contact face of the integrated circuit. Outer contact elements are distributed about a peripheral area of the membrane in a second pattern, and transmission lines extend from the inner contact elements to the outer contact elements respectively. The portions of conductive material of the support member comprise inner contact elements that are distributed about the aperture in a pattern corresponding generally to the second pattern, and transmission lines extending from the inner contact elements of the support member to testing apparatus. The membrane is secured to the support member so that it extends over the aperture, and the outer contact elements of the membrane are electrically connected to respective inner contact elements of the support member.

In a practical form of the probe assembly the support member is disposed horizontally in use, and the inner contact elements of the support member are exposed at the upper surface thereof. The outer contact elements of the membrane are exposed at the first main face of the membrane, and the membrane is clamped at its peripheral area to the upper surface of the support member using a body of elastomer material that spans the aperture in the support member. The first main face of the membrane is presented downwards, towards the interior of the aperture in the support member, and the integrated circuit is placed on a pedestal that is sufficiently small to enter the aperture in the support member. The body of elastomer material has a downwardly-projecting protuberance that engages the membrane directly above the inner contact elements, so that when the pedestal is raised, the contact areas of the integrated circuit engage the inner contact elements of the membrane, upward deformation of the membrane is resisted in a resiliently yieldable fashion and the body of elastomer material supplies contact force for achieving pressure contact between the contact areas of the integrated circuit and the inner contact elements of the membrane. The maximum linear dimension of the aperture in the support member is smaller than the diameter of a standard semiconductor wafer. Because the integrated circuit under test must be lifted into the aperture in the support member, the probe assembly is not well suited for testing integrated circuits in wafer form.

In U.S. patent application Ser. No. 904,600, filed Sept. 5, 1986, a probe suitable for testing integrated circuits in wafer form comprises a stiff support member formed with an aperture, and an elastically-deformable membrane. The membrane has first and second main faces, and is attached to the underside of the support member at its first main face so as to extend over the aperture. Both the support member and the membrane comprise dielectric material and portions of conductive material supported by the dielectric material in electrically-insulated relationship. The portions of conductive material of the membrane constitute inner contact elements exposed at the second main face of the membrane in a first pattern that corresponds to the pattern of contact areas on the contact face of the integrated circuit, outer contact elements distributed about a peripheral area of the first main face of the membrane in a second pattern, and transmission lines extending from the inner contact elements to the outer contact elements respectively. The portions of conductive material of the support member comprise inner contact elements on the underside of the support member that are distributed about the aperture in a pattern corresponding generally to the second pattern, and transmission lines extending from the inner contact elements of the support member to connectors for testing apparatus. The outer contact elements of the membrane are electrically connected to respective inner contact elements of the support member. The inner contact elements of the membrane each include a localized contact bump of conductive material, and the bumps project lower than any other parts of the probe that are at a distance from the contact bumps that is less than the diameter of the wafer containing the integrated circuit under test. Thus the contact bumps may engage bonding pads on an integrated circuit on a wafer situated below the support member.

In this probe assembly the membrane is soldered to the support member and cannot be easily replaced under typical field conditions. Consequently when the configuration of the integrated circuit to be tested changes, or when contact bumps on the membrane become worn, the entire probe assembly must be replaced.

SUMMARY OF THE INVENTION

In accordance with the invention, a probe suitable for use in testing an integrated circuit in wafer form comprises a stiff support member formed with an aperture, and a probe head comprising an elastically-deformable membrane. Both the support member and the membrane comprise dielectric material and portions of conductive material supported by the dielectric material in electrically-insulated relationship. The membrane has first and second main faces, the periphery of the first main face abutting an upper surface of the support member surrounding the aperture. Portions of conductive material of the membrane constitute inner contact elements exposed at the first main face in the central area of the membrane in a first pattern corresponding to the pattern of contact areas on the contact face of the integrated circuit, outer contact elements distributed in a second pattern about the periphery of the first main face of the membrane, and transmission lines extending from the inner contact elements to the outer contact elements respectively.

Portions of conductive material of the support member comprise contact elements exposed on the upper surface of the support member and distributed about the aperture in a pattern corresponding generally to the second pattern, and transmission lines extending from the inner contact elements of the support member to testing apparatus. The outer contact elements of the membrane include bumps of conductive material which project out of the first main face so as to engage and electrically connect to respective contact elements of the support member. A removable pressure plate clamps the peripheral area of the membrane between a resilient pad and the support member to hold the membrane in place on the support member and to insure good electrical contact between the bumps on the outer contact elements of the membrane and the contact elements of the support member.

Each inner contact element of the membrane also includes a bump of conductive material projecting downward from the first main face thereof. A shaft having ends of elastomeric material is situated between the pressure plate and the central area of the second main face of the membrane such that when the inner contact bumps engage corresponding contact areas on an integrated circuit in a wafer situated below the under surface of the support member, the elastomeric material resists upward movement of the inner contact elements in a resiliently yieldable fashion, thereby distributing pressure on the inner contact bumps.

It is accordingly an object of the invention to provide a probe assembly for facilitating test equipment access to contact areas on an integrated circuit in wafer form.

It is another object of the invention to a probe assembly with an easily replaceable probe head.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
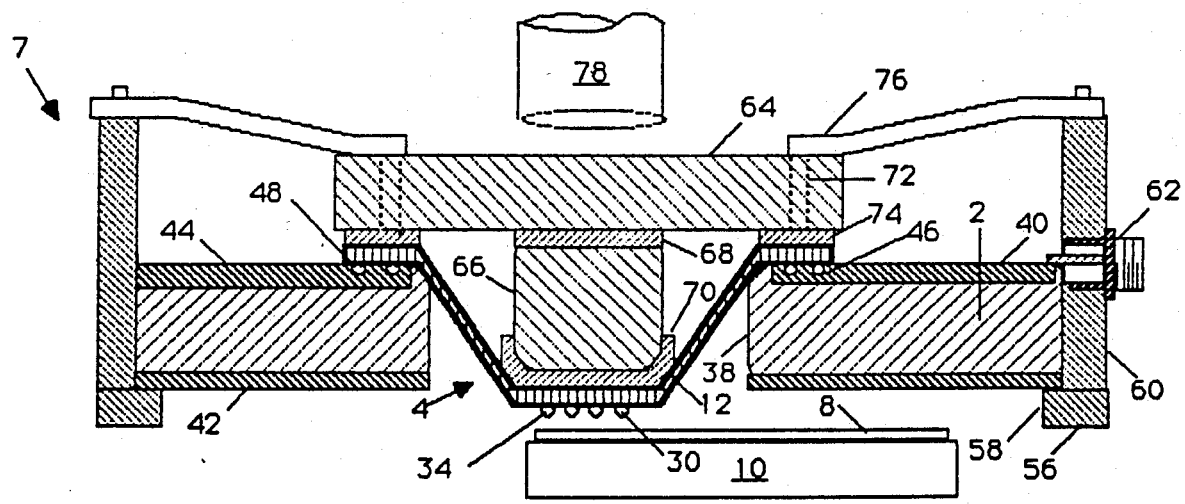
FIG. 1 is a sectional view of a probe assembly embodying the present invention.

The probe assembly shown in FIGS. 1-4 comprises a stiff support member 2, a probe head 4, and a peripheral support structure 7. A wafer 8 including an integrated circuit that is to be tested is mounted on a wafer support 10. The integrated circuit has contact pads (not shown) distributed over its upper face. The face of the integrated circuit over which the contact pads are distributed is referred to herein as the contact face of the integrated circuit.

The probe head 4 comprises a membrane 12 (best shown in FIGS. 2 and 4) including first and second layers 14 and 16 of flexible, transparent dielectric material, such as polyamide. Patterns 18 and 20 of electrically conductive material are formed on bottom and top sides of first layer 14 using standard photolithographic patterning and etching techniques. Second membrane layer 16 is then deposited on the top side of membrane layer 14, and an additional pattern 22 of electrically conductive material is formed on the top side of layer 16. Pattern 20 comprises conductor runs 24 in the interior of membrane 12 between first and second membrane layers 14 and 16, and patterns 18 and 22 comprise lower and upper ground planes 26 and 28 on the lower and upper surfaces, respectively, of membrane 12. The conductor runs 24 extend from a central area 25 of the membrane 12 toward the periphery of the membrane.

Contact bumps 30 of a conductive, wear resistant metal are formed at the lower ends of columns 32 of metal that extend through apertures in the first membrane layer 14 from the ends of the conductor runs 24. The apertures in membrane layer 14 are formed by conventional masking and etching techniques, and the metal of columns 32 and the contact bumps 30 is plated into the apertures. Different metals may be used for the columns 32 and the contact bumps 30, e.g., gold for the columns and nickel for the contact bumps, by using two different plating baths. Ground contact bumps 34 may also be plated on the ends of conductive ground runs 36 extending into central area 25 from lower ground plane 26, ground runs 36 being formed on the lower surface of layer 14 when ground plane 26 is formed thereon.

The geometric distribution of the contact bumps 30 and 34 over the lower surface of the membrane 12 corresponds to the geometric distribution of contact pads over the contact face of the integrated circuit. Therefore bumps 30 and 34 can be brought into electrically-conductive pressure contact with respective contact pads of the integrated circuit. The lower and upper ground planes 26 and 28 cover substantially all of the lower and upper surfaces of membrane 12, except for the transparent central area 25 of the membrane which is left uncovered by the ground planes in order to facilitate viewing of contact bumps 30 and 34 from above the membrane, and except for contact areas on the underside of the membrane 12 near its periphery, as described hereinbelow. When the probe head 4 is installed on support member 2, ground planes 26 and 28 are grounded, and conductor runs 24 and the ground planes 26 and 28 together constitute transmission lines extending substantially from the contact bumps 20 and 34 to peripheral areas of the membrane.

Figure 3:
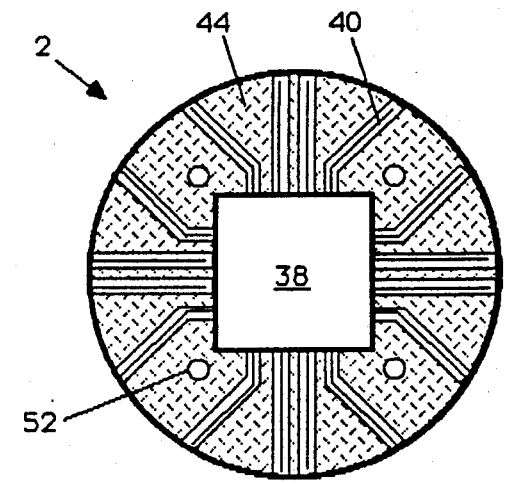
FIG. 3 is a plan view of the support member of the probe assembly of FIG. 1.

The support member 2 shown in plan view in FIG. 3 is circular and has a central rectangular aperture 38. Conductor runs 40 deposited on top of support member 2 extend between the periphery of the aperture 38 and the outer periphery of the support member. Ends of conductor runs 40 are exposed at the upper surface of support member 2 near the periphery of the aperture 38, and are also exposed at the periphery of the support member so as to form accessible contacts. The lower surface of the support member is covered by a continuous ground plane 42 (shown in FIG. 1) and the upper surface of the support member includes ground planes 44 spaced between conductor runs 40 (best shown in FIG. 3).

Ends of conductor runs 24 near the periphery of the under side of membrane 12 are exposed by etching away portions of lower membrane layer 14, and pairs of signal contact bumps 46 are mounted on these exposed ends of conductor runs 24. Pairs of ground contact bumps 48 are formed at the lower ends of columns 50 of metal that extend through apertures in the membrane layers 14 and 16 from ground plane 28 through ground plane 26. These apertures in membrane layer 14 are formed by conventional masking and etching techniques, and the metal of the columns 50 and the contact bumps 48 is plated into the apertures. Columns 50 conductively interconnect ground planes 26 and 28.

Figure 2:
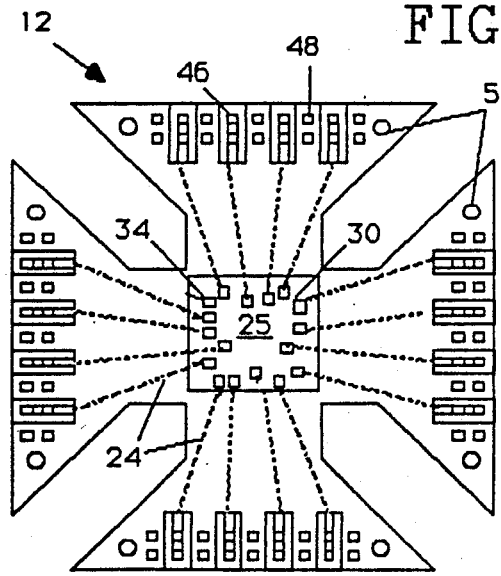
FIG. 2 is a plan view of the lower surface of the membrane of the probe assembly of FIG. 1 when the membrane is not installed in the probe assembly.

Contact bumps 46 and 48 are arranged such that when probe head 4 is mounted on support member 2, signal contact bumps 46 engage corresponding conductor runs 40 and ground contact bumps 48 engage corresponding ground planes 44. A set of four alignment pins 52 are mounted vertically on support member 2. When not installed on support member 2 (as shown in FIG. 2), membrane 12 is substantially flat and cross-shaped and has two holes 54 in each leg of the cross. Membrane 12 is mounted on support member 2 by slipping two adjacent holes 54 over each alignment pin 52 while pushing central area 25 of membrane 12 through aperture 38. When mounted on support member 2, membrane 23 is bowlshaped such that bumps 30 and 34 of central area 25 extend below the under surface of support member 2 while the under side of the periphery of membrane 12 engages the upper side of support member 2 near the periphery of aperture 38.

The peripheral support structure 7 comprises a circular plate 56 that is formed with a circular aperture 58 having a diameter greater than twice the diameter of the wafer 8. Around its periphery plate 56 is provided with an upstanding annulus 60, and support member 2 is received in a circular recess defined by the support structure 7. The annulus 60 carries coaxial connectors 62, only one of which is shown in FIG. 1, having their inner conductors connected to respective conductor runs 40 of the support member. Outer conductors of the connectors 62 are grounded through the conductive peripheral support structure 7, which is also connected to, and grounds, ground planes 42 and 44.

The support structure 7 further comprises a rigid, rectangular transparent pressure plate 64 and a rectangular shaft 66 of rigid transparent material. Shaft 66, which includes transparent, resilient, elastomer pressure pads 68 and 70 mounted on its top and bottom ends, is interposed between the lower surface of pressure plate 64 and the upper surface of central area 25 of membrane 12. The pressure pads 68 and 70 limit upward movement of the contact bumps 30 and 34 in resiliently yieldable fashion and distribute pressure evenly on the contact bumps. Pressure plate 64, which has a set of four guide holes 72 for receiving alignment pins 52, applies pressure to the periphery of membrane 12 through an annulus 74 of resilient elastomer interposed between pressure plate 64 and membrane 12. The pressure provided by pressure plate 64 ensures good electrical contact between signal contact bumps 46 of membrane 12 and the corresponding signal conductors 40 of support member 2 and between ground contact bumps 48 of the membrane and corresponding ground planes 44 of the support member.

A set of spring clips 76, pivotally mounted on annulus 60, apply pressure to pressure plate 64. The spring clips 76 and the alignment pins 52 simplify replacement of membrane 12 when an integrated circuit having a different contact arrangement is to be tested. Membrane 12 may be removed from the probe by swinging spring clips 76 aside and lifting pressure plate 64, annulus 74, shaft 66 and membrane 12 upward from pins 52. A new membrane 12 may then be installed by slipping holes 54 of the new membrane over pins 52, reinstalling annulus 74, shaft 66 and pressure plate 64, and then swinging clips 76 back into place above pressure plate 64.

A microscope 78 is used in conjunction with an X-Y (horizontal) positioning mechanism (not shown) to adjust support 10 to position the contact bumps 30 and 34 immediately over the appropriate contact pads of a selected integrated circuit of wafer 8. A Z (vertical) positioning mechanism is then used to bring about relative vertical movement between the probe assembly and the wafer support 10 so as to establish pressure contact between the contact bumps 30 and 34 and the appropriate pads of the integrated circuit. The flexibility of membrane 12 and the elasticity of pads 68 and 70 of shaft 66 ensure that the pressure contact will not damage the wafer, an also compensate for minor variations in the vertical positions of the connection pads and/or the contact surfaces of the bumps 30 and 34. When a first integrated circuit of wafer 8 has been tested, the positioning mechanism may automatically move the wafer support 10 to bring the next integrated circuit to be tested beneath the contact bumps, and that integrated circuit may then be tested. Because ground planes 26 and 42 lie between conductor runs 24 and 40 and wafer 8, the integrated circuit under test is shielded from signals on the conductor runs 24 and 40.

The spacing of ground planes 42 and 44 with respect to conductor runs 40 on support member 2 is adjusted such that the conductor runs and ground planes form transmission lines of constant characteristic impedance extending from connectors 62 to the edges of aperture 38. Similarly the spacing of ground planes 26 and 28 with respect to conductor runs 24 of membrane 12 is such that these conductor runs in conjunction with the ground planes form transmission lines of constant characteristic impedance extending from contacts 46 and 48 to contacts 30 and 34. In the illustrated probe assembly, the characteristic impedance of the transmission lines of membrane 12 is matched to that of the transmission lines of the support member 2, and therefore a high integrity signal path is provided between the contact pads of the integrated circuit and the coaxial connectors 62. The transmission lines of the support member 2 and membrane 12 may be used to provide power supply connections as well as signal connections to the integrated circuit under test. In the case of a power supply connection, it is desirable that the transmission line taper over the probe head, e.g., from 5 Ohm characteristic impedance at the periphery of the probe head to 50 Ohm characteristic impedance close to the column 32, and have a non-infinitesimal resistivity, in order to establish a desired damping of power supply transients generated by the operation of the integrated circuit under test.

No element of the probe assembly that lies within the aperture 58 of plate 56 projects downwards beyond the bumps 30 and 34. It will be noted that aperture 38 in support member 12 is substantially smaller than aperture 58, but because the central area 25 of membrane 12 extends through aperture 38 of the support member, and the diameter of aperture 58 is at least twice the diameter of wafer 8, the support member does not interfere with testing of any integrated circuits on the wafer.

Figure 4:
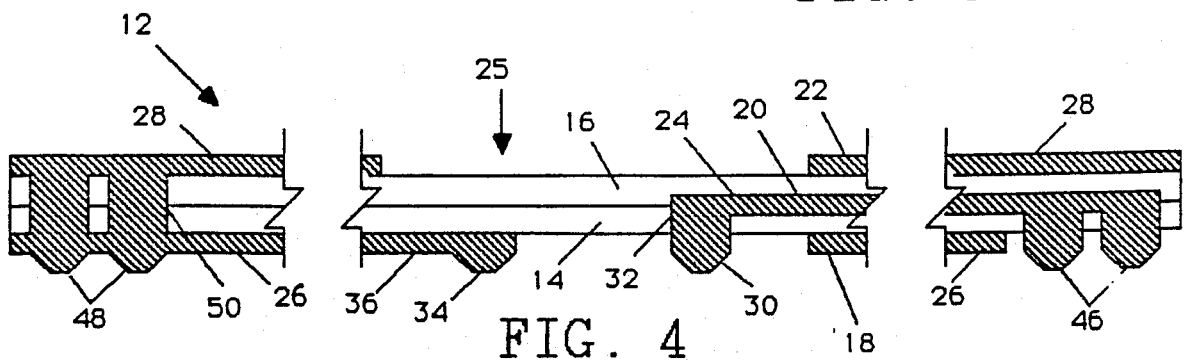
FIG. 4 is an enlarged sectional view of the membrane of FIG. 2.

To make them visible in the drawings, contact bumps 30 and 34 are shown in FIGS. 1, 2 and 4 exaggerated in size in respect to the size of the central area 25 of membrane 12, which central area corresponds generally to the surface area of the integrated circuit under test. In practical applications bumps 30 and 34 are much smaller, generally the size of the contact pads they engage, and it is possible to place enough contact bumps in central area 25 so as to provide several hundred high integrity connections to a single integrated circuit without difficulty.

The illustrated probe assembly provides several advantages over known probe assemblies. The probe head 4 is inexpensive and readily replaceable and can be manufactured using conventional techniques. In addition, the probe head is not easily damaged by contact with the integrated circuit under test and such contact does not damage the integrated circuit. Bumps 46 and 48 provide excellent electrical contact with conductor runs 40 of support member 2 without disrupting continuity of transmission line impedance as would be the case if conductor runs 40 and 24 were connected by bondwise jumpers, and therefore by avoiding the use of bondwires the bandwidth of the probe is improved. In addition to permitting membrane 12 to be easily replaced without special tools, the pressure connection between membrane 12 and support member 2 provides improved structural reliability over the use of a soldered connection.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A probe assembly for use in conveying signals between test apparatus and contact areas distributed on the contact face of an integrated circuit, comprising:
    a stiff support member having an upper face and an opposing lower face formed with an aperture through said upper and lower faces and having a plurality of first contact elements distributed in a first pattern on said upper face in an interior area of said support member surrounding said aperture;
    a membrane having first and second opposite main faces, having a plurality of second contact elements distributed about a peripheral area of said first main face in a pattern that corresponds to said first pattern, having a plurality of third contact elements distributed over an interior area of said first main face in a second pattern that corresponds to the pattern in which contact areas are distributed over the contact face of said integrated circuit, and having a plurality of first conductors extending from said second contact elements to said third contact elements respectively, said membrane being mounted on said support member such that the peripheral area of said membrane overlies said interior area of said support member surrounding said aperture, and such that said first contact elements of said support member are in electrically-conductive contact with respective second contact elements of the membrane, the interior area of said membrane extending through said aperture such that said third contact elements of the membrane are below the lower face of said support member;
    a first body of resilient dielectric material, said peripheral area of said membrane being positioned between said body and said interior area of said support member;
    a pressure plate mounted above said first body; and
    means for applying a downward force on said pressure plate and an opposing upward force on said support member such that the peripheral area of said membrane is clamped under pressure between said first body and said interior area of said support member.

2. A probe assembly according to claim 1 further comprising a second body including elastomeric material effective between said pressure plate and the membrane whereby movement of said third contact elements in the direction towards the second body is resisted in resiliently yieldable fashion by said elastomeric material.

3. A probe assembly for use in conveying signals between test apparatus and contact areas distributed on the contact face of an integrated circuit, comprising,
    a stiff support member having an upper face and an opposing lower face formed with an aperture through said upper and lower faces and having a plurality of first contact elements distributed in a first pattern on said upper face in an interior area of said support member surrounding said aperture;
    a membrane having first and second opposite main faces, having a plurality of second contact elements distributed about a peripheral area of said first main face in a pattern that corresponds to said first pattern, having a plurality of third contact elements distributed over an interior area of said first main face in a second pattern that corresponds to the pattern in which contact areas are distributed over the contact face of said integrated circuit, and having a plurality of first conductors extending from said second contact elements to said third contact elements respectively;
    means for securing said membrane to said support member such that the peripheral area of said membrane overlies said interior area of said support member surrounding said aperture, and such that said first contact elements of said support member are in electrically-conductive contact with respective second contact elements of the membrane, the interior area of said membrane extending through said aperture such that said third contact elements of the membrane are below the lower face of said support member; and wherein said support member comprises dielectric material and portions of conductive material supported by the dielectric material in electrically-insulated relationship, first portions of said conductive material constituting said plurality of first contact elements distributed over said upper face and second portions of said conductive material constituting a plurality of second conductors for conveying signals between said first contact elements and said test apparatus.

4. A probe assembly for use in conveying signals between test apparatus and contact areas distributed on the contact face of an integrated circuit, comprising, a stiff support member having an upper face and an opposing lower face formed with an aperture through said upper and lower faces and having a plurality of first contact elements distributed in a first pattern on said upper face in an interior area of said support member surrounding said aperture;

a membrane having first and second opposite main faces, having a plurality of second contact elements distributed about a peripheral area of said first main face in a pattern that corresponds to said first pattern, having a plurality of third contact elements distributed over an interior area of said first main face in a second pattern that corresponds to the pattern in which contact areas are distributed over the contact face of said integrated circuit, and having a plurality of first conductors extending from said second contact elements to said third contact elements respectively;

means for securing said membrane to said support member such that the peripheral area of said membrane overlies said interior area of said support member surrounding said aperture, and such that said first contact elements of said support member are in electrically-conductive contact with respective second contact elements of the membrane, the interior area of said membrane extending through said aperture such that said third contact elements of the membrane are below the lower face of said support member; and wherein said membrane comprises a lower membrane layer of flexible dielectric material, and an upper membrane layer of flexible dielectric material, said first conductors being supported between said lower and upper membrane layers, said third contact elements of the membrane comprising conductive bumps extending from said first conductors through said lower membrane layer.

5. A probe assembly for use in conveying signals between test apparatus and contact areas distributed on the contact face of an integrated circuit, comprising, a stiff support member having an upper face and an opposing lower face formed with an aperture through said upper and lower faces and having a plurality of first contact elements distributed in a first pattern on said upper face in an interior area of said support member surrounding said aperture;

a membrane having first and second opposite main faces, having a plurality of second contact elements distributed about a peripheral area of said first main face in a pattern that corresponds to said first pattern, having a plurality of third contact elements distributed over an interior area of said first main face is a second pattern that corresponds to the pattern in which contact areas are distributed over the contact face of said integrated circuit, and having a plurality of first conductors extending from said second contact elements to said third contact elements respectively;

means for securing said membrane to said support member such that the peripheral area of said membrane overlies said interior area of said support member surrounding said aperture, and such that said first contact elements of said support member are in electrically-conductive contact with respective second contact elements of the membrane, the interior area of said membrane extending through said aperture such that said third contact elements of the membrane are below the lower face of said support member; and wherein said means for securing said membrane to said support member comprises a body of resilient dielectric material covering said peripheral area of said membrane such that said peripheral area is situated between said body and said interior area of said support member, and means for applying a downward force on said body and an opposing upward force on said support member such that the peripheral area of said membrane is clamped under pressure between said body and said interior area of said support member.

6. A probe assembly for use in conveying signals between test apparatus and contact areas distributed on the contact face of an integrated circuit, comprising, a stiff support member having an upper face and an opposing lower face formed with an aperture through said upper and lower faces and having a plurality of first contact elements distributed in a first pattern on said upper face in an interior area of said support member surrounding said aperture;

a membrane having first and second opposite main faces, having a plurality of second contact elements distributed about a peripheral area of said first main face in a pattern that corresponds to said first pattern, having a plurality of third contact elements distributed over an interior area of said first main face in a second pattern that corresponds to the pattern in which contact areas are distributed over the contact face of said integrated circuit, and having a plurality of first conductors extending from said second contact elements to said third contact elements respectively;

means for securing said membrane to said support member such that the peripheral area of said membrane overlies said interior area of said support member surrounding said aperture, and such that said first contact elements of said support member are in electrically-conductive contact with respective second contact elements of the membrane, the interior area of said membrane extending through said aperture such that said third contact elements of the membrane are below the lower face of said support member; and wherein each of said third contact elements comprises at least one conductive bump extending below the first main face of said membrane and wherein said means for securing said membrane to said support member comprises:

a body of resilient dielectric material covering said peripheral area of said membrane such that said peripheral area is situated between said body and said interior area of said support member, and clamping means for applying a downward force on said body and an opposing upward force on said support member such that the conductive bumps comprising said second contact elements of said membrane engage said first contact elements of said support member under pressure.

7. The probe assembly according to claim 3 wherein a third portion of said conductive material comprises ground conductors distributed on said upper face of said circuit board, said ground conductors and said plurality of second conductors forming a plurality of constant impedance transmission lines.

8. The probe assembly according to claim 7, wherein a fourth portion of said conductive material comprises a first ground plane substantially covering the lower face of said support member.

9. A probe assembly according to claim 4 wherein said membrane further comprises conductive material forming a ground plane on an under side of said lower membrane layer.

10. A probe assembly according to claim 4 wherein said membrane further comprises conductive material forming a ground plane on an upper side of said upper membrane layer.

11. A probe assembly according to claim 4 wherein said membrane further comprises:

first conductive material forming a first ground plane on an under side of said lower membrane layer, second conductive material forming a second ground plane on an upper side of said upper membrane layer, and conductive paths extending through said first and second membrane layer interconnecting said first and second ground planes.

* * * * *